(12) United States Patent
Yoshida (10) Patent No.: US 7,029,965 B2
(45) Date of Patent: Apr. 18, 2006

(54) SEMICONDUCTOR DEVICE AND MANUFACTURING METHOD THEREOF

(75) Inventor: Kazuhiro Yoshida, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/021,664

(22) Filed: Dec. 22, 2004

(65) Prior Publication Data

US 2005/0098832 A1    May 12, 2005

Related U.S. Application Data

(62) Division of application No. 10/735,759, filed on Dec. 16, 2003, now abandoned.

(30) Foreign Application Priority Data

Dec. 19, 2002    (JP) .............................. 2002-367764

(51) Int. Cl.
*H01L 21/336* (2006.01)

(52) U.S. Cl. ...................... 438/197; 438/153; 438/154; 438/155; 438/167; 438/738; 438/735; 438/736; 438/749

(58) Field of Classification Search ................ 438/197, 438/153, 154, 155, 167, 738, 735, 736, 737, 438/749; 257/274, 260, 368
See application file for complete search history.

(56) References Cited

FOREIGN PATENT DOCUMENTS

| JP | 08-255838 | 10/1996 |
| JP | 08-340213 | 12/1996 |

*Primary Examiner*—Minhloan Tran
*Assistant Examiner*—Tan Tran
(74) *Attorney, Agent, or Firm*—Keating & Bennett, LLP (57) ABSTRACT

A method for efficiently manufacturing a semiconductor device, the semiconductor device having an FET and a pn junction diode provided on the same semiconductor substrate, the FET having a Schottky junction for a gate electrode and a gate recess, includes the steps of forming a channel layer, a first etching stopper layer, an n-type common layer, a second etching stopper layer, a p-type layer, and a third etching stopper layer on the semiconductor substrate in that order; etching away the p-type layer and the third etching stopper layer in specific regions; simultaneously forming a source electrode, a drain electrode, a cathode; forming a mask having an opening for forming a gate recess and a gate electrode and an opening for forming an anode; forming the gate recess by etching while the third etching stopper layer prevents the p-type layer from being etched; and simultaneously forming the gate electrode and the anode.

3 Claims, 10 Drawing Sheets

SEMICONDUCTOR DEVICE AND MANUFACTURING METHOD THEREOF

This application is a Divisional Application of U.S. patent application Ser. No. 10/735,759 filed Dec. 16, 2003, now abandoned.

BACKGROUND OF THE INVENTION

1. Field of the Invention

The present invention relates to semiconductor devices and manufacturing methods thereof, and more particularly, relates to a semiconductor device including a field effect transistor and a diode on the same semiconductor substrate, and also relates to a manufacturing method thereof.

2. Description of the Related Art

As a technique for forming a field effect transistor (FET) and a diode on the same semiconductor substrate, for example, techniques disclosed in Japanese Unexamined Patent Application Publication Nos. 8-340213 and 8-255838 may be considered.

In Japanese Unexamined Patent Application Publication No. 8-340213, a technique has been disclosed in which, on the same semiconductor substrate, a part of one layer is used an active layer for a Schottky diode, and another part of the one layer is used as an active layer for an FET.

In addition, in Japanese Unexamined Patent Application Publication No. 8-255838, the structure has been disclosed in which a PIN diode, an FET, and a heterojunction bipolar transistor (HBT) are formed on the same semiconductor substrate. In this structure, for the PIN diode, the FET, and the HBT, the individual active layers are formed separately.

According to Japanese Unexamined Patent Application Publication No. 8-340213, a contact layer of an anode of a Schottky diode and contact layers of a drain and a source electrode of an FET are formed from the same layer. However, when the contact layers mentioned above are only formed from the same layer, only one step of forming a layer can be omitted in a process for growing active layers. As a result, the effect of reducing the number of manufacturing steps and the effect of reducing cost cannot be fully achieved. In addition, according to Japanese Unexamined Patent Application Publication No. 8-340213, although a manufacturing method of a semiconductor device disclosed therein has not been clearly described, due to variations in degree of etching in an etching step which may be necessary for the manufacturing, variations in properties of the diode and the FET may be increased in some cases.

On the other hand, according to the technique disclosed in Japanese Unexamined Patent Application Publication No. 8-255838, since the active layers of the diode, the FET, and the HBT are individually formed by selective growth, reduction in number of manufacturing steps and reduction in cost cannot be sufficiently achieved.

In addition to the desire of forming the active layer of an FET and that of a diode from a common layer, in order to reduce the number of manufacturing steps, it has been desired that at least one electrode (a gate electrode, a drain electrode, or a source electrode) of the FET and at least one electrode (an anode and a cathode) of the diode are preferably formed at the same time.

When an FET having a Schottky junction for a gate electrode and a diode having a Schottky junction are formed on the same semiconductor substrate, since a layer is provided which is used in common for the active layers thereof, the desire described above can be relatively easily fulfilled.

On the other hand, when an FET, which has a Schottky junction for a gate electrode and has a gate recess, and a pn junction diode are formed on the same semiconductor substrate, the desire described above cannot be so easily fulfilled for the following reasons.

That is, when a drain electrode and a source electrode of the FET are formed on respective contact layers, and a cathode of a diode is simultaneously formed on an n-type layer which is the same type as that of the contact layers, since these electrodes are ohmic electrodes to an n-type layer, by using the same metal, the formation of the electrodes described above can be easily realized. However, metals for a gate electrode, which is a Schottky electrode, and an anode of a diode, which is an ohmic electrode provided on a p-type layer, are formed of a different type of metal from that for the drain electrode and the like, and hence the electrodes described above must be formed in a separate step.

It is not always impossible to simultaneously form a gate electrode, a drain electrode, and a source electrode. However, since a specific step must be additionally required, it is not practical in order to achieve cost reduction. In addition, although both the anode and the cathode are ohmic electrodes in view of functionality, the types of semiconductor layers on which they are to be formed are different from each other, that is, a p-type layer and an n-type layer, different electrode materials must be used, and as a result, the anode and the cathode cannot be simultaneously formed.

According to the situations described above, a desire may arise in that at least a gate electrode and an anode are simultaneously formed. When the gate electrode is formed, a mask is formed for forming a gate recess, and recess etching is then performed. Subsequently, in general, by using the same mask as described above without being removed from the position for the recess forming, a step of forming a gate electrode is performed by deposition or the like.

As described above, the reason that the same mask is used in the etching step of forming the gate recess and in the step of forming the gate electrode by deposition or the like is that by using the same mask, the gate electrode can be formed while the positional accuracy obtained in forming the gate recess is maintained. When a different mask is used, or when once the mask is removed and is then again disposed, the gate electrode cannot be formed with high positional accuracy.

As described above, when the gate electrode and the anode are simultaneously formed using the same mask as that used for forming the gate recess, it is necessary that the mask has an opening at a position at which the anode is to be formed, that is, at which a p-type layer is to be exposed. However, when an opening is provided in the mask for exposing the p-type layer, in an etching step of forming the gate recess, the p-type layer is also etched, and as a result, it disadvantageously becomes difficult to form a diode having desired properties.

SUMMARY OF THE INVENTION

In order to overcome the problems described above, preferred embodiments of the present invention provide a manufacturing method of a semiconductor device, which can solve the problems described above, and is also to provide a semiconductor device which is advantageously formed by the manufacturing method described above.

According to a preferred embodiment of the present invention, a semiconductor device includes a semiconductor substrate, a field effect transistor provided thereon, the transistor having a gate recess and a Schottky junction for a gate electrode, and a pn junction diode provided on the semiconductor substrate, the diode having an n-type layer and a p-type layer, wherein at least one of electrodes of the field effect transistor and at least one of electrodes of the diode are composed of metal conductors which are simultaneously formed.

In the semiconductor device described above, a source electrode and a drain electrode of the field effect transistor and a cathode of the diode are preferably composed of metal conductors which are simultaneously formed, and in addition, the gate electrode of the field effect transistor and an anode of the diode are preferably composed of metal conductors which are simultaneously formed.

In addition, at least one of active layers of the field effect transistor and at least one of active layers of the diode are preferably composed of layers which are obtained from a common active layer provided on the semiconductor substrate by epitaxial growth. In the case described above, contact layers of the field effect transistor and the n-type layer of the diode are preferably composed of layers which are obtained from a common n-type layer provided on the semiconductor substrate by epitaxial growth. Furthermore, it is more preferable that the contact layers are provided on a channel layer on the semiconductor substrate of the field effect transistor and that the p-type layer of the diode is provided on the n-type layer thereof.

As described above, when at least one of the active layers of the field effect transistor and at least one of the active layers of the diode are obtained from the common active layer, the active layer of the field effect transistor is preferably separated from the active layer of the diode by ion implantation or etching.

According to another preferred embodiment of the present invention, a method for advantageously manufacturing a semiconductor device which includes a semiconductor substrate, a field effect transistor provided thereon, having a gate recess and a Schottky junction for a gate electrode, a pn junction diode provided on the semiconductor substrate, and the structure as described above, is such that a step of preparing the semiconductor substrate is first performed, and subsequently, a channel layer for the field effect transistor, a first etching stopper layer, an n-type common layer used for contact layers for the field effect transistor and for an n-type layer for the diode, a second etching stopper layer, a p-type layer for the diode, and a third etching stopper layer are formed on the semiconductor substrate in that order by epitaxial growth.

Next, an etching step is performed which etches away the p-type layer and the third etching stopper layer in regions in which the field effect transistor and a cathode of the diode are to be formed while the etching is to be stopped by the second etching stopper layer. That is, etching is performed so that a region remains in which the p-type layer of the diode is to be formed.

Subsequently, a step is performed which simultaneously forms a source electrode and a drain electrode for the field effect transistor and the cathode for the diode so as to have an ohmic contact with the n-type common layer.

Next, a step is performed which forms a mask having openings which expose a region of the n-type common layer in which the gate recess for the field effect transistor is to be formed and at least a portion of the third etching stopper layer.

While the third etching stopper layer prevents the p-type layer from being etched, a step of performing etching through the mask for forming the gate recess in the n-type common layer is performed so that the etching is to be stopped by the first etching stopper layer.

Next, a step is performed through the same mask as described above which simultaneously forms the gate electrode for the field effect transistor which has a Schottky contact with the channel layer and an anode for the diode which has an ohmic contact with the p-type layer, and subsequently, the mask is removed.

The method for manufacturing a semiconductor device, according to various preferred embodiments of the present invention, may further include, after the etching step described above: a step of performing etching or ion implantation for the channel layer and the n-type common layer in order to separate a region in which the field effect transistor is to be formed from a region in which the diode is to be formed.

In addition, the third etching stopper layer is preferably formed to have a thickness that is preferably larger than the total thickness of the first and the second etching stopper layers.

Other features, elements, steps, processes, characteristics and advantages of the present invention will become more apparent form the following detailed description of preferred embodiments with reference to the attached drawings.

DETAILED DESCRIPTION OF PREFERRED EMBODIMENTS

Figure 6:
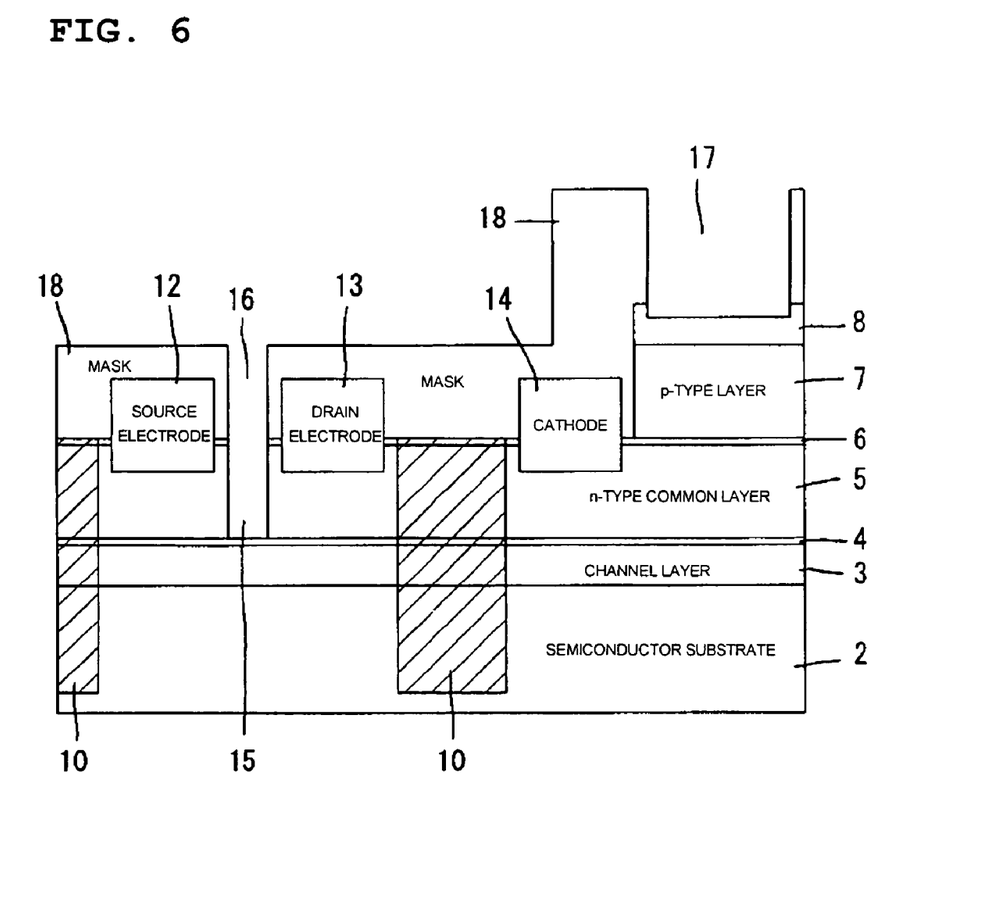
FIG. 6 is a schematic cross-sectional view of the structure formed in a sixth step performed after the fifth step mentioned with reference to FIG. 5.
Figure 7:
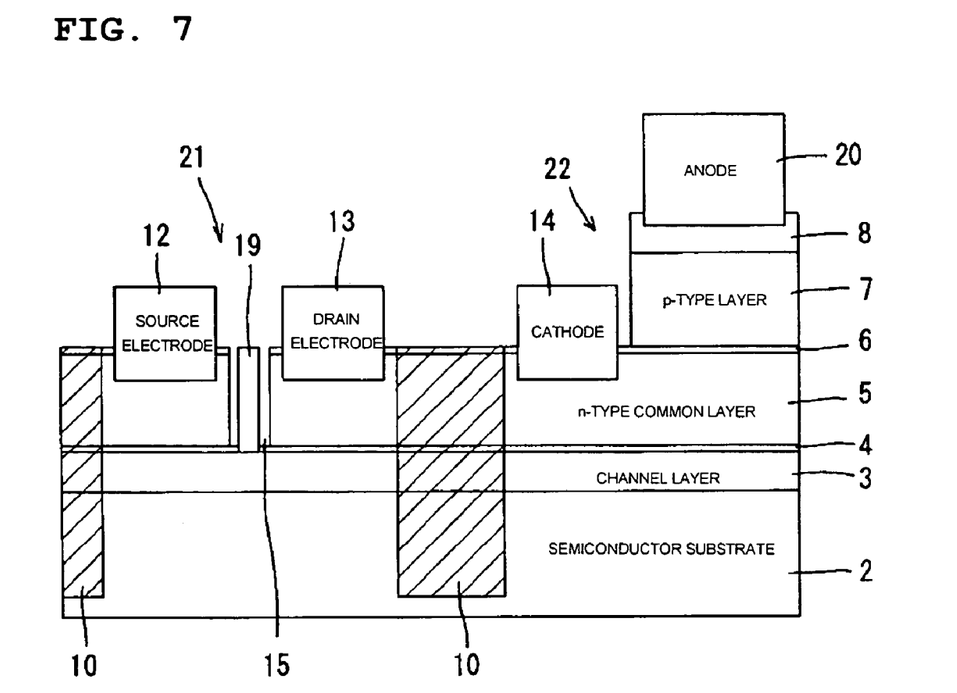
FIG. 7 is a schematic cross-sectional view of the structure formed in a seventh step performed after the sixth step mentioned with reference to FIG. 6.
Figure 8:
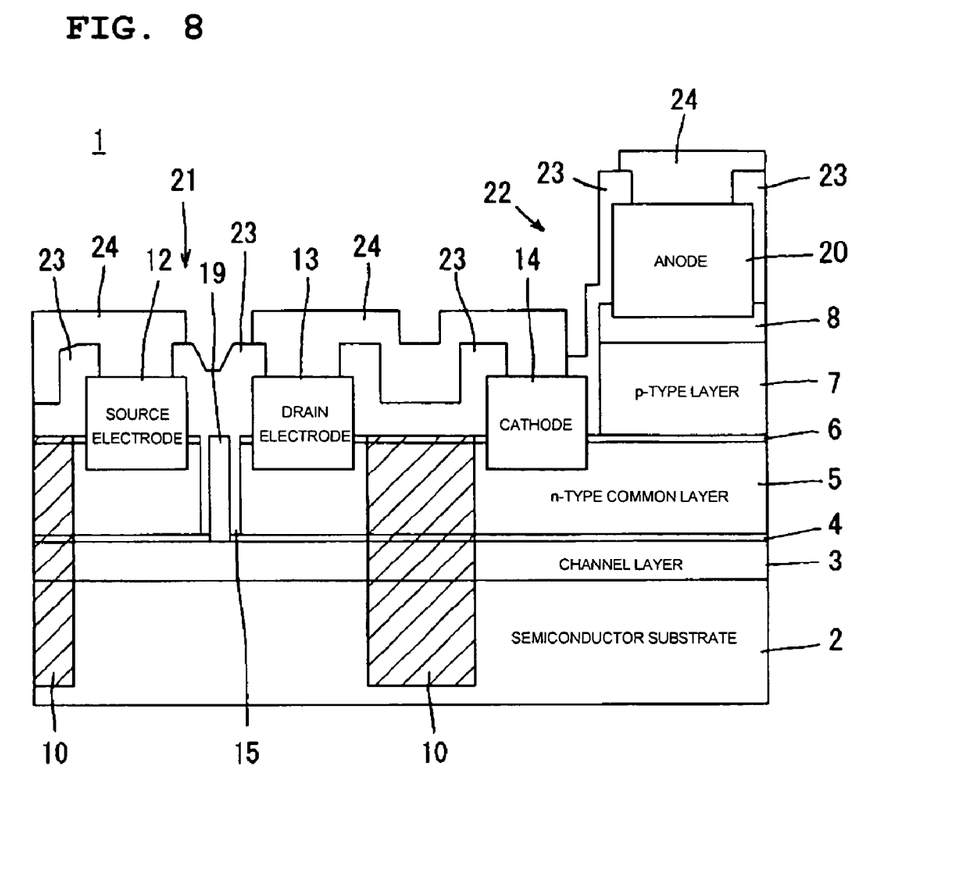
FIG. 8 is a schematic cross-sectional view of the structure of a semiconductor device formed in an eighth step performed after the seventh step mentioned with reference to FIG. 7.

FIGS. 1 to 8 are schematic views for illustrating preferred embodiments of the present invention; a semiconductor device 1 is shown in FIG. 8 as a finished product; and typical steps performed for forming the semiconductor device 1 are sequentially shown in FIGS. 1 to 7. In FIGS. 1 to 8, the steps of manufacturing one semiconductor device 1 are shown. However, a plurality of semiconductor devices 1 is actually formed on a semiconductor wafer having a relatively wide area. In addition, in the cross-sectional views shown in FIGS. 1 to 8, the dimension is exaggerated in the thickness direction to some extent, and in order to more clearly show the individual elements in the figures, the dimensions thereof are not always shown accurately.

Figure 1:
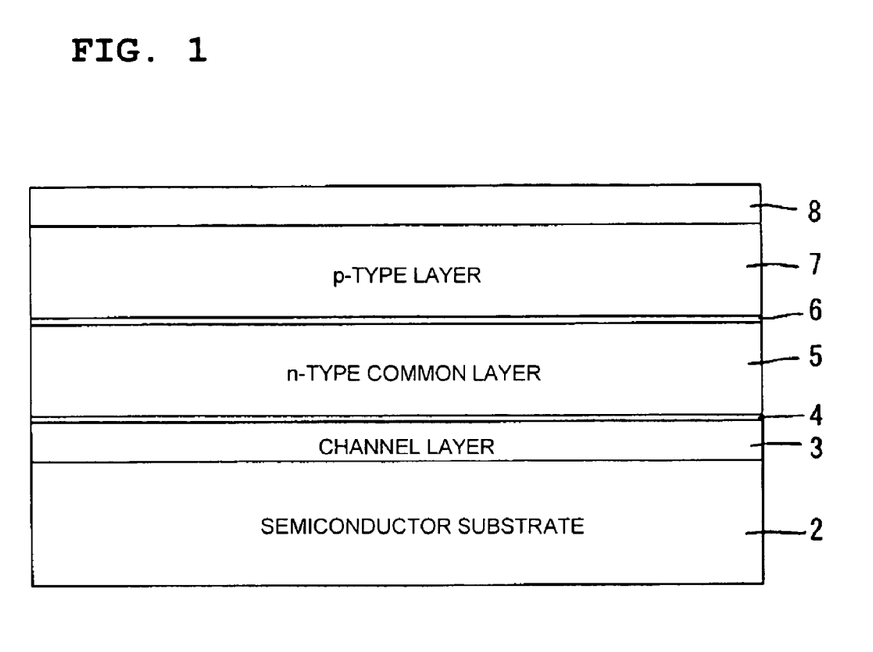
FIG. 1 is a schematic cross-sectional view of the structure formed in a first step of a manufacturing method of a semiconductor device, according to one preferred embodiment of the present invention.

With reference to FIG. 1, a semiconductor substrate 2 is first prepared. For example, the semiconductor substrate 2 is preferably composed of GaAs.

Next, on the semiconductor substrate 2, using a method such as molecular beam epitaxy (MBE) or metalorganic chemical vapor deposition (MOCVD), active layers for a field effect transistor (FET) and active layers for a diode are formed by epitaxial growth as described below.

First, a channel layer 3 for the FET is formed. The channel layer 3 is formed, for example, of an n-type GaAs.

Next, on the channel layer 3, a first etching stopper layer 4 is formed, and this etching stopper layer 4 is formed, for example, of AlGaAs.

Subsequently, on the first etching stopper layer 4, an n-type common layer 5 is formed which is used as contact layers for the FET and an n-type layer for the diode. The n-type common layer 5 is formed, for example, of n-type GaAs. The thickness of the n-type common layer 5 and the concentration of an impurity contained therein are determined so as to sufficiently decrease the contact resistance. In general, the thickness of the n-type common layer 5 is, for example, about 10 nm to about 100 nm, and the concentration of an n-type impurity is set to an optional value in the range of from about $1 \times 10^{18}$ to about $1 \times 10^{19}/cm^3$.

On the n-type common layer 5, a second etching stopper layer 6 is formed. This etching stopper layer 6 is also formed, for example, of AlGaAs as is the first etching stopper layer 4.

Next, on this second etching stopper layer 6, a p-type layer 7 is formed for the diode. This p-type layer 7 is formed, for example, of p-type GaAs. The thickness and the concentration of an impurity contained in the p-type layer 7 are determined in accordance with the functions of the diode which is to be formed. For example, when a Zener diode is formed, the thickness is preferably in the range of from about 10 nm to about 100 nm and the concentration of a p-type impurity is set in the range of from about $5 \times 10^{17}/cm^3$ to about $1 \times 10^{19}/cm^3$. When a varactor diode is formed, the thickness is preferably in the range of from about 10 nm to about 100 nm, and the concentration of a p-type impurity is preferably in the range of from about $1 \times 10^{17}/cm^3$ to about $1 \times 10^{18}/cm^3$ so as to be inclined in the depth direction.

On the p-type layer 7, a third etching stopper layer 8 is then formed. As is the first and the second etching stopper layers 4 and 6, this etching stopper layer is also formed, for example, of AlGaAs.

The thicknesses of the first, the second, and the third etching stopper layers 4, 6, and 8 are to be determined in accordance with the selectivity obtained in etching steps described later but are generally in the range of from about 3 nm to about 20 nm. As can be seen from the step described later, the third etching stopper layer 8 preferably has a thickness that is larger than the total thickness of the first and the second etching stopper layers 4 and 6, and as one example, the thickness of the third etching stopper layer 8 is approximately three times the thickness of each of the first and the second etching stopper layers 4 and 6.

In addition, the second etching stopper layer 6 may be formed of a p-type, an n-type, or an i-type semiconductor, and in accordance with the type of semiconductor, a pn junction position of the diode is changed. When the second etching stopper layer 6 is formed of a p-type semiconductor, the interface between the second etching stopper layer 6 and the n-type common layer 5 becomes a pn junction surface; when the second etching stopper layer 6 is formed of an n-type semiconductor, the interface between the second etching stopper layer 6 and the p-type layer 7 becomes a pn junction surface; and when the second etching stopper layer 6 is formed of an i-type semiconductor, the central portion of the second etching stopper layer 6 in the thickness direction becomes a pn junction surface.

The carrier concentrations of the etching stopper layers 4, 6, and 8 are determined so that the functions of the FET and the diode are not damaged.

Figure 2:
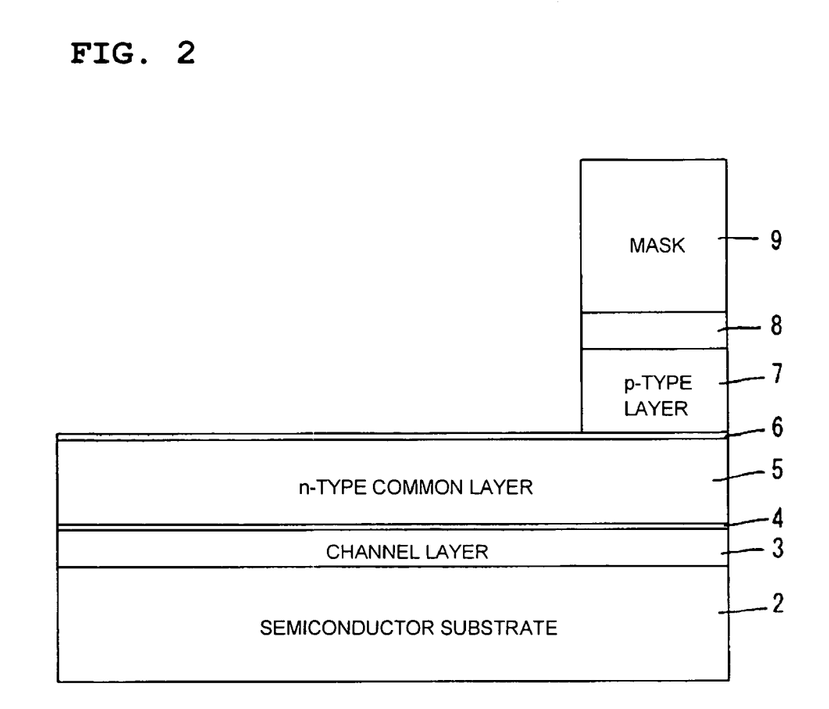
FIG. 2 is a schematic cross-sectional view of the structure formed in a second step performed after the first step mentioned with reference to FIG. 1.

Next, as shown in FIG. 2, a mask 9 is formed by a photolithographic technique so as to cover a portion of the p-type layer 7 at which the active layer of the diode is to be formed.

As also shown in FIG. 2, etching is performed through the mask 9, and by this etching, the p-type layer 7 and the third etching stopper layer 8 in regions in which the FET is to be formed and a cathode of the diode is to be formed are removed. This etching is stopped by the second etching stopper layer 6. By this etching step, a portion of the p-type layer 7 is allowed to remain which is formed into a p-type layer of the diode.

This etching may be performed by dry etching or wet etching. When wet etching is performed, as an etching solution, for example, a solution containing phosphoric acid, hydrogen peroxide, and water, or a solution containing citric acid, hydrogen peroxide, and water may be advantageously used, and when an etching solution is appropriately selected as described above, the etching can be easily stopped by the second etching stopper layer 6 made of AlGaAs.

In addition, although not shown in the figure, by this etching, alignment marks to be used in a subsequent photolithographic step are preferably formed at the same time.

After the etching described above is completed, the mask 9 is removed using an organic solvent and/or oxygen plasma.

Figure 3:
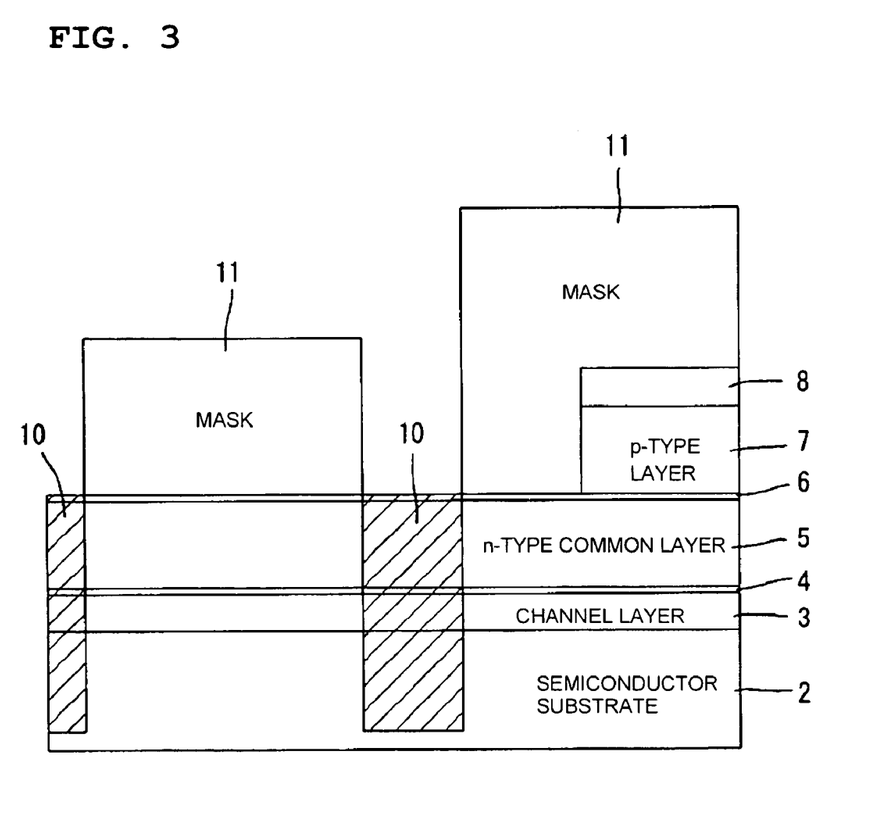
FIG. 3 is a schematic cross-sectional view of the structure formed in a third step performed after the second step mentioned with reference to FIG. 2.

Next, as shown in FIG. 3, in order to separate a region in which the FET is to be formed from a region in which the diode is to be formed, ion implantation is performed for the channel layer 3 and the n-type common layer 5, thereby forming the ion implanted regions 10. In this preferred embodiment, the ion implanted regions 10 are formed so as to reach the semiconductor substrate 2.

In more particular, a mask 11 is formed using a photolithographic technique so as to cover regions in which the active layers of the FET and the diode are to be formed, and ion implantation is performed through the mask 11 for regions other than the regions in which the active layers of the FET and the diode are to be formed, thereby forming the ion implanted regions 10. The ion implanted regions 10 are high resistance regions, and hence the region in which the FET is to be formed and the region in which the diode is to be formed can be separated from each other.

In the ion implantation described above, for example, oxygen ions are used, and the energy of the oxygen ions is set in accordance with the thicknesses of the channel layer 3 and the n-type common layer 5. In this preferred embodiment, in addition to the separation of the region in which the FET is to be formed from the region in which the diode is to be formed, the ion implanted regions 10 are formed so as to separate a region in which an FET is to be formed from a region in which a diode is to be formed, the regions being not shown in the figure and being adjacent to each other.

After the ion implantation step is completed as described above, the mask 11 is removed using an organic solvent and/or oxygen plasma.

Figure 4:
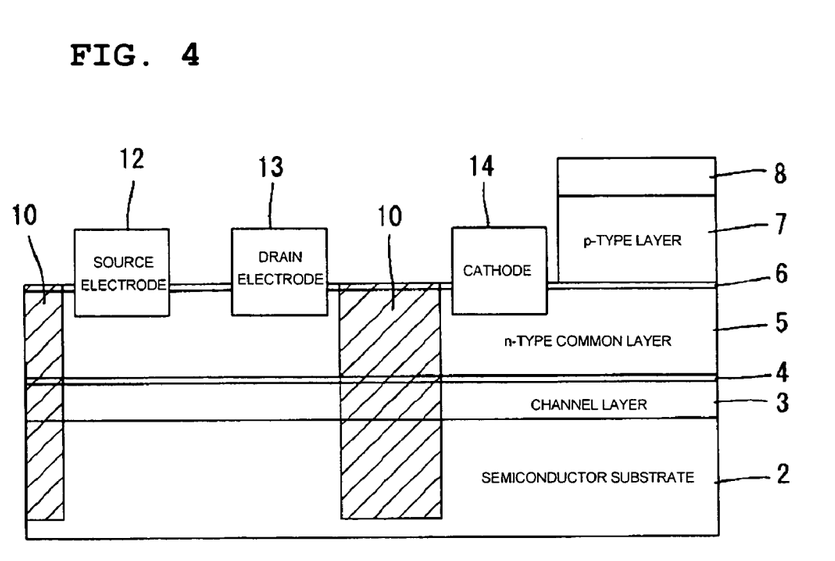
FIG. 4 is a schematic cross-sectional view of the structure formed in a fourth step performed after the third step mentioned with reference to FIG. 3.

Next, as shown in FIG. 4, a source electrode 12 and a drain electrode 13 for the FET and a cathode 14 for the diode are simultaneously formed so as to have an ohmic contact with the n-type common layer 5. In general, the electrodes 12 to 14 are formed preferably by a lift-off method.

More particularly, although not shown in the figure, a mask is first formed using a photolithographic technique, and through this mask, a metal is deposited so as to have an ohmic contact, for example, with n-type GaAs forming the n-type common layer 5. Subsequently, by an organic solvent, the mask is removed together with an unnecessary metal formed thereon. After the removal of the mask described above, metal conductors remaining on the n-type common layer 5 form the source electrode 12, the drain electrode 13, and the cathode 14.

As a metal deposited in the deposition step described above, in order to have an ohmic contact, for example, with n-type GaAs forming the n-type common layer 5, an Au—Ge mixed crystal, In, or other suitable material may be used. As one example, a laminate composed of Au—Ge, Ni, and Au may be used. In addition, in order to obtain a superior ohmic contact, alloying treatment is performed at a temperature of approximately 400° C.

Figure 5:
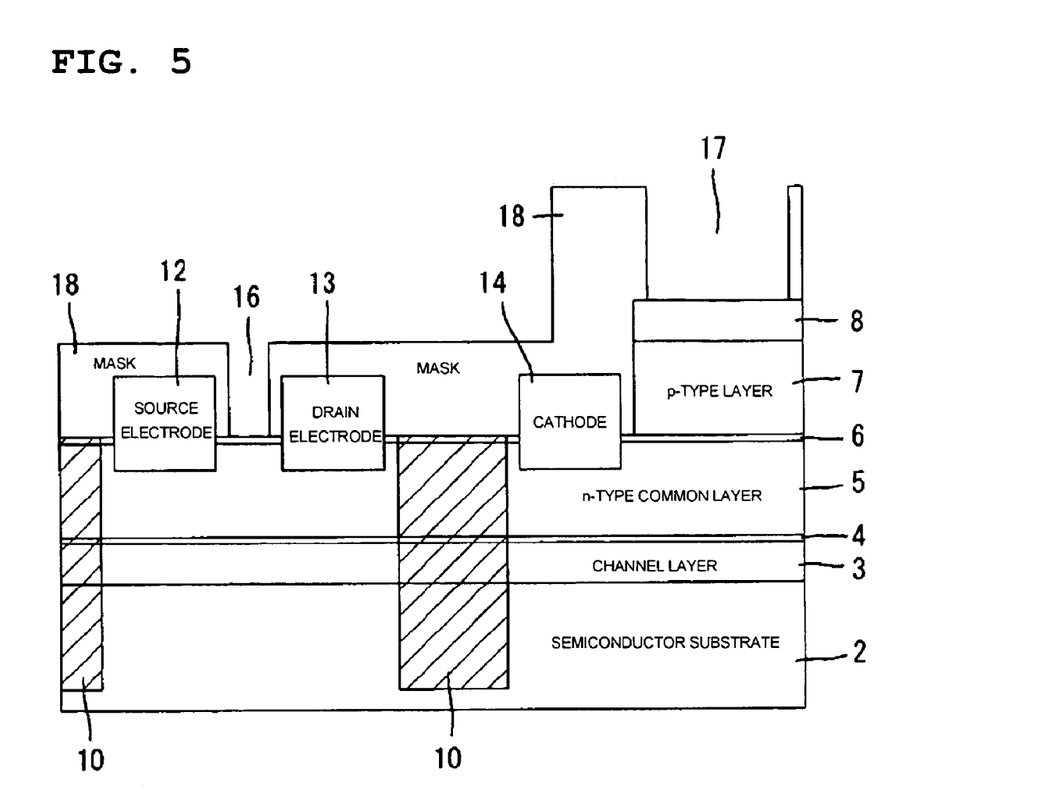
FIG. 5 is a schematic cross-sectional view of the structure formed in a fifth step performed after the fourth step mentioned with reference to FIG. 4.

Next, as shown in FIG. 5, a mask 18 is formed by a photolithographic technique having openings 16 and 17 for exposing a gate recess 15 (see FIG. 6) for the FET in the n-type common layer 5 and at least a part of the third etching stopper layer 8.

Next, as shown in FIG. 6, etching is performed through the opening 16 of the mask 18, and as a result, the gate recess 15 for adjusting the properties of the FET is formed in the n-type common layer 5. This etching may be performed by dry etching or wet etching. When wet etching is performed, as an etching solution, for example, a solution containing phosphoric acid, hydrogen peroxide, and water, or a solution containing citric acid, hydrogen peroxide, and water may be used. This etching can be easily stopped by the first etching stopper layer 4.

In addition, through the opening 17 of the mask 18, the etching is also performed. However, due to the presence of the third etching stopper layer 8, the p-type layer 7 is prevented from being etched. In consideration of the function of the third etching stopper layer 8, the third etching stopper layer 8 is preferably formed to have a thickness larger than the total thickness of the first and the second etching stopper layers 4 and 6.

That is, in the etching for forming the gate recess 15 as described above, the second etching stopper layer 6 on the n-type common layer 5 is first etched, and at the same time, the third etching stopper layer 8 on the p-type layer 7 is also etched by the same thickness as that of the second etching stopper layer 6. Next, when the n-type common layer 5 is etched, the third etching stopper layer 8 is not substantially etched. Next, when the etching for the n-type common layer 5 is completed, this etching was completed. However, at the final stage of this etching, the first etching stopper layer 4 present under the n-type common layer 5 is also etched to a certain extent, and in accordance with the amount etched by this etching described above, the third etching stopper layer 8 is also etched. Accordingly, in order to allow the third etching stopper layer 8 to remain on the p-type layer 7 after the etching is completed as described above, the thickness of the third etching stopper layer 8 must be larger than the total thickness of the first and the second etching stopper layers 4 and 6. Hence, as described above, the thickness of the third etching stopper layer 8 is preferably larger than the total thickness of the first and the second etching stopper layers 4 and 6.

Next, as shown in FIG. 7, through the same mask 18, a gate electrode 19 used for the FET is formed so as to have a Schottky contact with the channel layer 3, and at the same time, an anode 20 used for the diode is formed so as to have an ohmic contact with the p-type layer 7.

The gate electrode 19 and the anode 20 are generally formed by a lift-off method. That is, through the mask 18, a metal is deposited, and subsequently, the mask 18 is removed together with the metal formed thereon by an organic solvent. As a result, the remaining metal conductors form the gate electrode 19 and the anode 20.

A metal used for forming the gate electrode 19 and the anode 20 is a metal which has a Schottky contact, for example, with n-type GaAs forming the channel layer 3 and which has an ohmic contact, for example, with p-type GaAs forming the p-type layer 7, and as the metal described above, for example, Ti, Pt, Pd, W, WSi, or Cr may be used. As one example, for the gate electrode 19 and the anode 20, a metal laminate composed of Ti, Pt, and Au may be used. In addition, in order to realize a superior ohmic contact between the anode 20 and the p-type layer 7, alloying treatment is preferably performed at a temperature of approximately 300° C.

By the steps described above, as shown in FIG. 7, a FET 21 and a diode 22 are formed on the semiconductor substrate 2.

Next, as shown in FIG. 8, a protective insulating film 23 made, for example, of SiN is formed, and a metal wiring layer 24 forming a circuit is then formed, thereby forming the semiconductor device 1 such as an MMIC.

According to the above manufacturing method described above, in addition to steps of forming a general FET, when only one step of forming the p-type layer 7 for the diode is additionally performed while the crystals are grown, the diode functions can be additionally obtained. As described above, since only one step of forming one layer is additionally performed while the crystals are grown, an increase in cost does not substantially occur, and the diode functions can be advantageously obtained.

In addition, since the etching for forming the p-type layer for the diode can be precisely controlled, the variation in properties can be suppressed as is the case in which the diode is not additionally provided.

Figure 9:
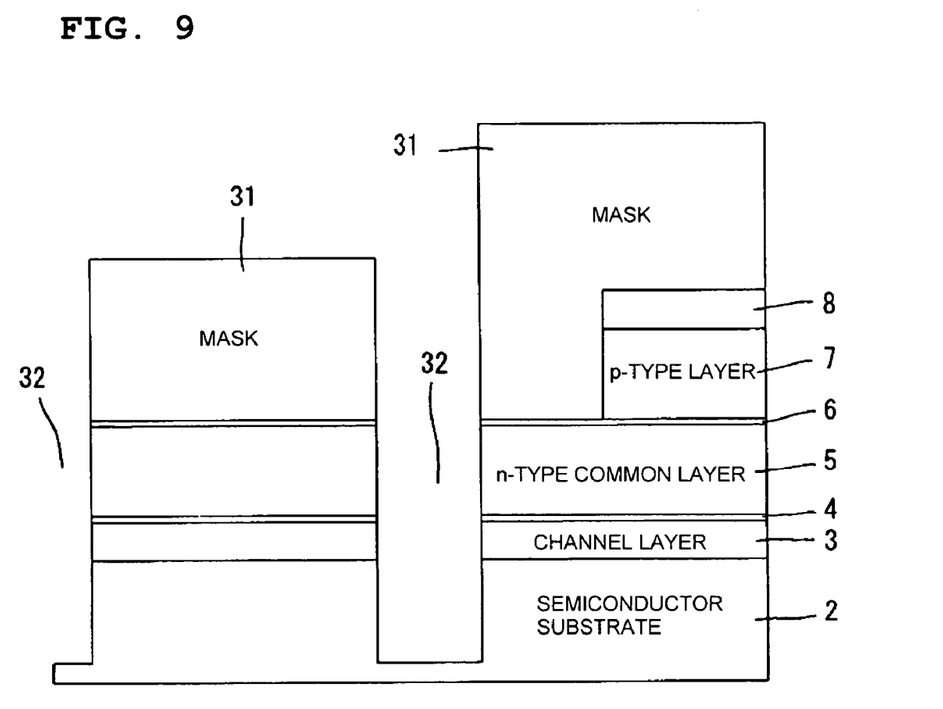
FIG. 9 is a schematic cross-sectional view of the structure formed in a step corresponding to the step mentioned with reference to FIG. 3 for illustrating a manufacturing method of a semiconductor device, according to another preferred embodiment of the present invention.
Figure 10:
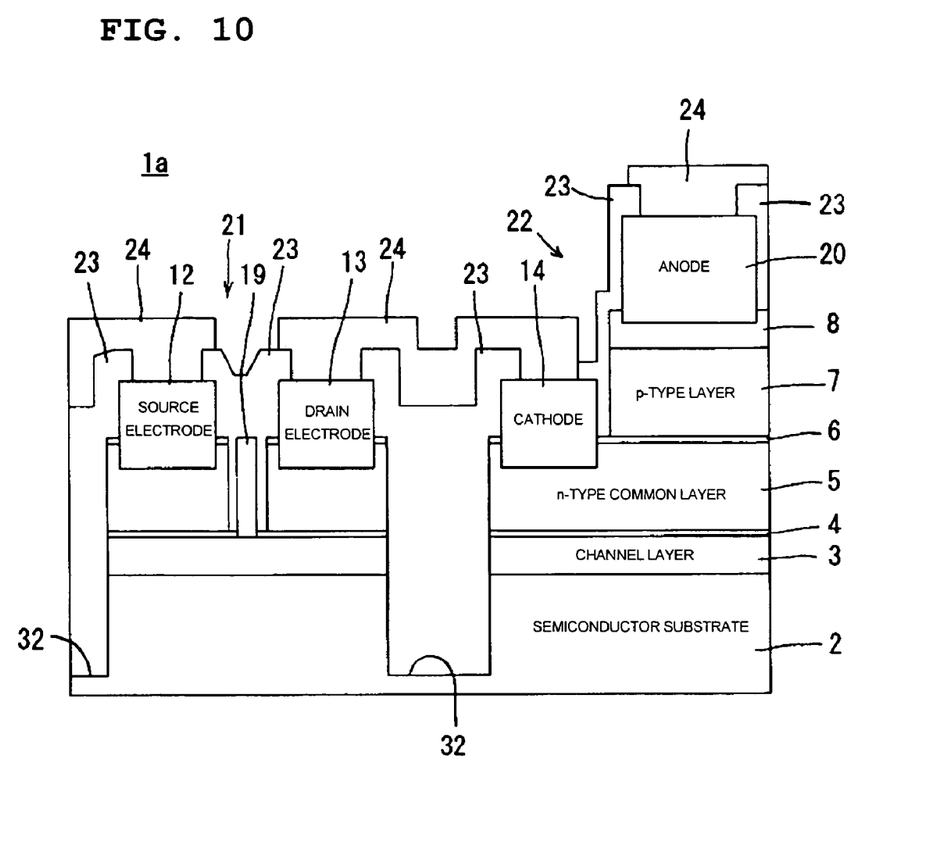
FIG. 10 is a schematic cross-sectional view of the structure of a semiconductor device formed in a step corresponding to the step mentioned with reference to FIG. 8, according to the preferred embodiment mentioned in FIG. 9.

FIGS. 9 and 10 are views for illustrating another preferred embodiment of the present invention. FIG. 9 corresponds to FIG. 3, and FIG. 10 corresponds to FIG. 8. The same reference numerals of the elements in FIGS. 3 and 8 designate the same elements in FIGS. 9 and 10, and descriptions thereof are omitted.

In this preferred embodiment, in order to separate the region in which the FET is to be formed from the region in which the diode is to be formed, etching is performed.

As in the preferred embodiment described above, after the steps shown in FIGS. 1 and 2 are performed, as shown in FIG. 9, a mask 31 is formed using a photolithographic technique so as to cover regions in which the active layers of the FET and the diode are to be formed.

Next, through the mask 31, dry etching or wet etching is performed, thereby removing the channel layer 3 and the n-type common layer 5 in regions other than the regions in which the active layers of the FET and the diode are to be formed. By this removal using the etching, etching regions 32 are formed, and by the presence of the etching regions 32, the region in which the FET is to be formed is separated from the region in which the diode is to be formed.

Subsequently, the mask 31 is removed, and steps substantially equivalent to those described with reference to FIGS. 4 to 7 are then performed. Next, as shown in FIG. 10, a protective insulating film 23 is formed so as to fill each etching region 32, and the metal wiring layer 24 is then formed, thereby forming a semiconductor device 1a.

The rest of the structure and the advantages of the preferred embodiment described with reference to FIGS. 9 and 10 are the same as those of the preferred embodiment described with reference to FIGS. 1 to 8.

In the preferred embodiments described with reference to the figures, an FET having a single-recess structure is shown. However, even when an FET having a multi-recess structure is formed in which a low resistance layer is interposed between the n-type common layer 5 and the channel layer 3, the same advantages as those of the preferred embodiments shown in the figures can also be obtained.

As described above, according to the method for manufacturing a semiconductor device of preferred embodiments of the present invention, a semiconductor device can be manufactured to include a semiconductor substrate, an FET provided thereon having a gate recess and a Schottky junction for a gate electrode, and a pn junction diode provided on the semiconductor substrate, the diode having an n-type layer and a p-type layer. In the case described above, the diode can be formed without significantly increasing the number of steps necessary for forming the FET, as described below.

That is, as the layers formed on the semiconductor substrate by epitaxial growth, the channel layer for the FET, the first etching stopper layer, the n-type common layer used for the contact layers for the FET and for the n-type layer for the diode, the second etching stopper layer, the p-type layer for the diode, and the third etching stopper layer are mentioned, and among those layers mentioned above, the layers formed in addition to the layers necessary for forming the FET are only the p-type layer and the third etching stopper layer. In consideration of the additional layers, the cost is not substantially increased.

In addition, after the p-type layer and the third etching stopper layer in the region in which the FET is to be formed and in the region in which the cathode of the diode is to be formed are removed by etching so that the etching is to be stopped by the second etching stopper layer, the source electrode and the drain electrode for the FET and the cathode for the diode are simultaneously formed so as to have an ohmic contact with the n-type common layer, and hence a specific step of forming the cathode for the diode is not required.

Since the mask formed for forming the gate recess is used when the gate electrode is formed and, in addition, is also designed to have a function of forming the anode of the diode, the gate electrode and the anode can be simultaneously formed. In the case described above, in etching for forming the gate recess, undesirable etching of the p-type layer can be advantageously prevented by the presence of the third etching stopper layer.

As described above, compared to the case in which the FET is formed, without substantially increasing the number of manufacturing steps, the diode can be formed on the same semiconductor substrate.

In the manufacturing method of preferred embodiments of the present invention, when the thickness of the third etching stopper layer is formed to be larger than the total thickness of the first and the second etching stopper layers, in the etching step of forming the gate recess as described above, the p-type layer can be more reliably prevented from being undesirably etched.

When the manufacturing method of a semiconductor device, according to preferred embodiments of the present invention, is used, a semiconductor device having the following novel structure can be manufactured.

That is, a semiconductor device is formed in which an FET having a Schottky junction for a gate electrode and a gate recess and a pn junction diode are formed on the same semiconductor substrate, and in which at least one of electrodes of the FET and at least one of electrodes of the diode are composed of metal conductors which are simultaneously formed.

In more particular, a semiconductor device is formed in which a source electrode and a drain electrode of the FET and a cathode of the diode are composed of metal layers which are simultaneously formed, and in which a gate electrode of the FET and an anode of the diode are composed of metal layers which are simultaneously formed.

In addition, a semiconductor device can be manufactured in which at least one of active layers of the FET and at least one of active layers of the diode are composed of layers which are formed from a common active layer provided on the semiconductor substrate by epitaxial growth.

More particularly, contact layers of the FET and an n-type layer of the diode are preferably composed of layers which are formed from a common n-type layer, that is, the n-type common layer, and in even more particular, the structure can be obtained in which the contact layers are provided on the channel layer on the semiconductor substrate for forming the FET and in which the p-type layer of the diode is provided on the n-type layer thereof.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. A method for manufacturing a semiconductor device including a semiconductor substrate, a field effect transistor provided on the semiconductor substrate and having a gate recess and a Schottky junction for a gate electrode, and a pn junction diode provided on the semiconductor substrate, the method comprising:
   a step of preparing the semiconductor substrate;
   a step of forming a channel layer for the field effect transistor, a first etching stopper layer, an n-type common layer used for contact layers for the field effect transistor and for an n-type layer for the diode, a second etching stopper layer, a p-type layer for the diode, and a third etching stopper layer on the semiconductor substrate in that order by epitaxial growth;

an etching step of etching away the p-type layer and the third etching stopper layer in regions in which the field effect transistor and a cathode of the diode are to be formed so that the etching is to be stopped by the second etching stopper layer;

a step of simultaneously forming a source electrode and a drain electrode for the field effect transistor and the cathode for the diode so as to have an ohmic contact with the n-type common layer;

a step of forming a mask having openings which expose a region of the n-type common layer in which the gate recess for the field effect transistor is to be formed and at least a portion of the third etching stopper layer;

a step of performing etching through the mask for forming the gate recess in the n-type common layer while the third etching stopper layer prevents the p-type layer from being etched, in which the etching is stopped by the first etching stopper layer;

a step of simultaneously forming the gate electrode for the field effect transistor which has a Schottky contact with the channel layer and an anode for the diode which has an ohmic contact with the p-type layer through the mask; and a step of removing the mask.

2. The method for manufacturing a semiconductor device, according to claim 1, further comprising, after the etching step:

performing etching or ion implantation for the channel layer and the n-type common layer in order to separate a region in which the field effect transistor is to be formed from a region in which the diode is to be formed.

3. The method for manufacturing a semiconductor device, according to claim 1, wherein the third etching stopper layer is formed to have a thickness that is larger than a total thickness of the first and the second etching stopper layers.

* * * * *